United States Patent
Piazza

(10) Patent No.: US 7,518,296 B2
(45) Date of Patent: Apr. 14, 2009

(54) PIEZOELECTRIC RESONATOR WITH SHORT-CIRCUITS PREVENTING MEANS

(75) Inventor: Silvio Dalla Piazza, St-Imier (CH)

(73) Assignee: ETA SA Manufacture Horlogère Suisse, Grenchen (CH)

( * ) Notice: Subject to any disclaimer, the term of this patent is extended or adjusted under 35 U.S.C. 154(b) by 0 days.

(21) Appl. No.: 11/832,813

(22) Filed: Aug. 2, 2007

(65) Prior Publication Data

US 2008/0030107 A1 Feb. 7, 2008

Related U.S. Application Data

(63) Continuation-in-part of application No. 11/461,824, filed on Aug. 2, 2006, now abandoned.

(51) Int. Cl.
*H01L 41/08* (2006.01)
*H03H 9/21* (2006.01)
*H03H 9/215* (2006.01)

(52) U.S. Cl. .................................................. 310/370
(58) Field of Classification Search ........... 310/370
See application file for complete search history.

(56) References Cited

U.S. PATENT DOCUMENTS

| 4,253,036 A | 2/1981 | Kizaki |
| 4,384,232 A | 5/1983 | Debely |
| 6,768,247 B2 * | 7/2004 | Kitamura et al. ............ 310/370 |
| 7,075,218 B2 * | 7/2006 | Matsudo et al. ............. 310/370 |
| 2002/0125794 A1 | 9/2002 | Tanaya et al. |
| 2004/0191944 A1 | 9/2004 | Shioji et al. |

FOREIGN PATENT DOCUMENTS

EP 1 528 673 A1 5/2005

OTHER PUBLICATIONS

European search report issued in counterpart application No. EP 06 11 8326, completed Jan. 19, 2007.

* cited by examiner

*Primary Examiner*—Jaydi SanMartin
(74) *Attorney, Agent, or Firm*—Griffin & Szipl, P.C.

(57) ABSTRACT

The tuning fork piezoelectric resonator (1) according to the invention comprises a base part (4) from which protrudes first and second parallel vibrating arms (2, 3) carrying a set of excitation electrodes (5, 6) to make them vibrate, the set of excitation electrodes being formed by conductive deposits and comprising central electrodes (6a, 6b) on opposite main surfaces (9a, 9b) and lateral electrodes (5a, 5b) covering lateral surfaces (10a, 10b) of each vibrating arm, the central electrodes of the first arm and the lateral electrodes of the second arm being connected to a first pole of an excitation source and the lateral electrodes of the first arm and the central electrodes of the second arm being connected to a second pole of the excitation source, wherein on each vibrating arm, the conductive deposits forming the central electrodes and lateral electrodes are made for the ones with an oxidizable metal and for the others with an unoxidizable metal or conversely.

5 Claims, 2 Drawing Sheets

A-A

PIEZOELECTRIC RESONATOR WITH SHORT-CIRCUITS PREVENTING MEANS

This application is a Continuation-in-Part of U.S. patent application Ser. No. 11/461,824, filed Aug. 2, 2006, now abandoned the entire disclosure of which is incorporated herein By reference.

FIELD OF INVENTION

The present invention concerns piezoelectric resonators and more particularly resonators of small dimensions which are most often used for making frequency generators in particular for portable electronic equipment, in numerous fields such as horology, information technology, telecommunications and the medical field.

BACKGROUND OF THE INVENTION

Such a resonator of small dimensions is disclosed in the prior art document U.S. Pat. No. 4,384,232, which is incorporated herewith by way of reference. This document discloses a tuning fork resonator formed by a base and two vibrating arms protruding from the base. Each arm carries metallization which forms central electrodes on the opposite main surfaces and lateral electrodes along the edges of each arm. The central electrodes of one arm are connected to the lateral electrodes of the other arm and to one pole of the supply. The other central and lateral electrodes are similarly connected to the other pole of the supply. Electrodes are subjected to electric fields to make the arms vibrate.

The central and lateral electrodes are arranged with a fixed spacing there between so that these do not short-circuited one another. Nevertheless, this spacing is chosen as thin as possible in order to have better crystal impedance for the resonator. As a result, if even a small amount of dust falls between the central and lateral electrodes or if some gas is present in the vicinity of the electrodes, a short-circuit is likely to occur, and the vibration of the vibrating arms may then malfunction.

Some existing solutions of the prior art consist in providing a short-circuit prevention section formed between the central and lateral electrodes of each vibrating arm and arranged in the form of an insulating film that may be either located between the central and lateral electrodes or arranged to cover both the central and lateral electrodes. However, although these prior solutions effectively prevent short-circuits between central and lateral electrodes, they further present several drawbacks, and in particular, they require to readapt the whole design of the resonator in order to keep the same characteristics such as resistance and crystal impedance of the resonator. This required design adaptations renders the making process more expensive which is not desirable for such mass produced item.

SUMMARY OF THE INVENTION

The main goal of the present invention is to provide a tuning fork resonator having not only means for preventing short-circuits between the central and lateral electrodes of each vibrating arm but also a simple implementation of such means which does not disturb the resonator characteristics. For this purpose, a first embodiment in accordance with the present invention relates to a tuning fork piezoelectric resonator comprising a base part from which extend first and second parallel vibrating arms carrying a set of excitation electrodes to make them vibrate, the set of excitation electrodes being formed by conductive deposits and comprising central electrodes on opposite main surfaces and lateral electrodes covering lateral surfaces of each vibrating arm, the central electrodes of the first arm and the lateral electrodes of the second arm being connected to a first terminal of an electrical excitation source and the lateral electrodes of the first arm and the central electrodes of the second arm being connected to a second terminal of said electrical excitation source, wherein on each vibrating arm, the conductive deposits forming the central electrodes and lateral electrodes are made for the ones with an oxidizable metal and for the others with an unoxidizable metal or conversely.

Advantageous embodiments are defined in accordance with the following. In accordance with a second embodiment of the invention, a tuning fork piezoelectric resonator according to the first embodiment is further modified so that the lateral electrodes of both arms are made with an oxidizable metal and the central electrodes Of both arms are made with an unoxidizable metal. In accordance with a third embodiment of the invention, a tuning fork piezoelectric resonator according to the first embodiment is further modified so that the oxidizable metal is chosen from among chrome, copper, aluminum, titanium. In accordance with a fourth embodiment of the invention, a tuning fork piezoelectric resonator according to the first embodiment is further modified so that the unoxidizable metal is chosen from between silver and gold. In accordance with a fifth embodiment of the present invention, a tuning fork piezoelectric resonator according to the fourth embodiment is further modified so that the central electrodes are formed by a tie layer coated by a metallic layer of the unoxidizable metal.

BRIEF DESCRIPTION OF THE DRAWINGS

Other features and advantages of the invention will appear upon reading the following description which refers to the annexed drawings in which.

DETAILED DESCRIPTION OF THE INVENTION

The invention will described hereinafter by way of a non limiting example given in relation with FIGS. 1 and 2.

Figure 1:
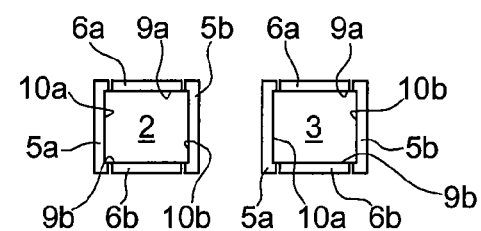
FIG. 1 represents a tuning fork resonator according to a preferred embodiment of the present invention.
Figure 1:
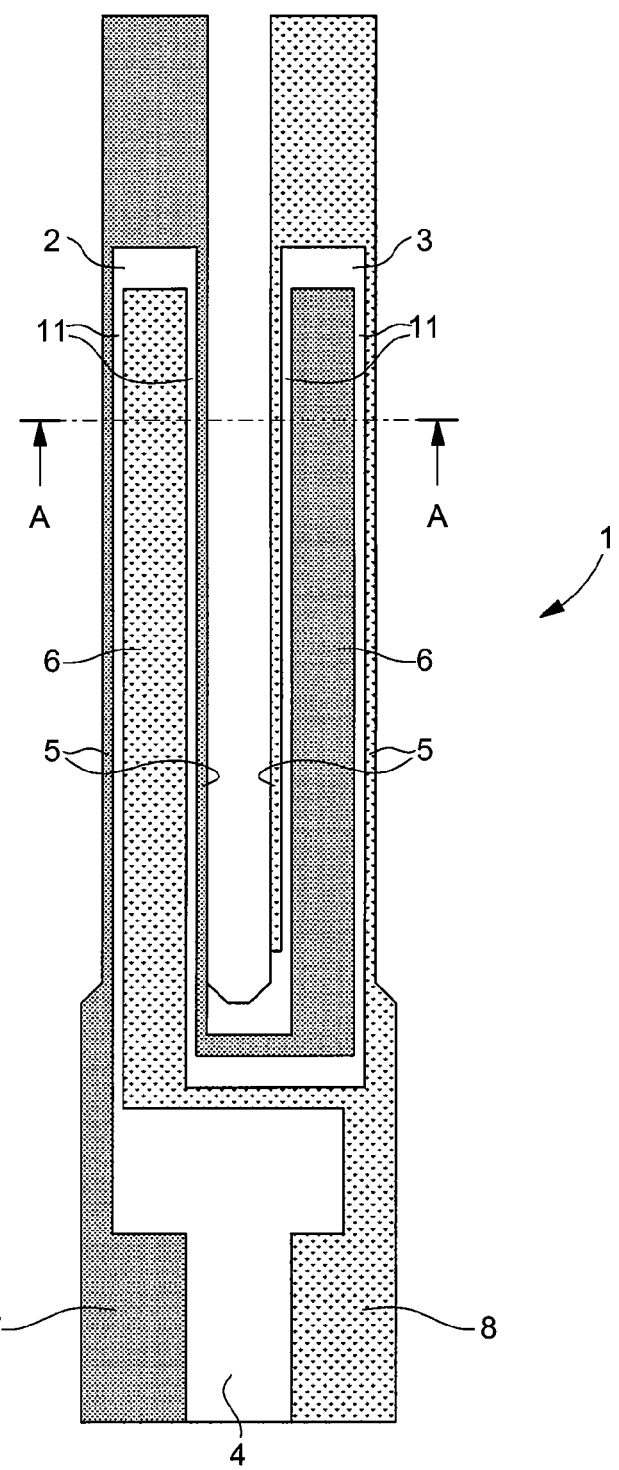

In a preferred embodiment shown in FIG. 1, the resonator, designated by the reference numeral 1, includes a tuning fork shaped part with two vibrating arms 2 and 3 joined by a base part 4, the whole assembly being made from a single piece of a piezoelectric material such as quartz. The base 4 and the arms 2 and 3 carry metallization, i.e. conductive deposits, which form, on the arms, a set of electrodes 5 and 6 which allow the arms to be subjected to electric fields to make them vibrate and, on base 4, connection pads 7 and 8 connected, on the one hand, to the set of electrodes and, on the other hand, to first and second terminals of an electrical excitation source or supply (not shown). Alternatively, connection pads 7 and 8 may be arranged on a third central arm (not shown) located between the vibrating arms 2 and 3.

As represented on the cross-sectional view A-A of FIG. 1, each arm presents four faces, two opposite main surfaces 9a and 9b and two lateral surfaces 10a and 10b. The excitation electrodes are formed by conductive deposits and comprise central electrodes 6a and 6b on opposite main surfaces 9a and 9b and lateral electrodes 5a and 5b covering lateral surfaces 10a and 10b of each vibrating arm 2 and 3.

The spacing 11 between central 6a, 6b and lateral 5a, 5b electrodes is very small in order to optimize the resonator behavior. Such a small spacing or gap may be filled in by dust or gas; therefore central and lateral electrodes may short-circuit one another. To prevent such short-circuit occurrence, on each vibrating arm, the exposed surfaces of the conductive deposits forming the central electrodes and lateral electrodes are made for the ones from an oxidizable metal and for the others from an unoxidizable metal, or conversely.

Actually, as will be explained in more details later, in order to further simplify the method for making the resonator, the exposed surfaces of central electrodes 6a and 6b of both arms 2 and 3 should preferably be made from an unoxidizable metal (such as gold) and the exposed surfaces of lateral electrodes 5a and 5b of both arms 2 and 3 should preferably be made from an oxidizable metal (such as chromium) Nevertheless according to alternative implementations of the making process, it is also possible to provide an oxidizable metal for the central electrodes and an unoxidizable metal for the lateral electrodes or alternatively to provide an oxidizable metal for the lateral electrodes of a first arm and for the central electrodes of the second arm, while providing an unoxidizable metal for the central electrodes of the first arm and for the lateral electrodes of the second arm.

According to the present invention, the oxidizable metal must be chosen among the metals whose oxides have electrical insulating properties, so that, when a layer of oxide is formed over an electrode of the resonator, this layer of oxide will act as an electrical insulator. Many metals are known to form electrically insulating oxides.

Preferably, the oxidizable metal should further be chosen among metals that spontaneously form a superficial layer of oxide when they are left in an atmosphere containing oxygen. Accordingly, the oxidizable metal can for example be chosen among chrome, copper, aluminum and the unoxidizable metal may be chosen among silver and gold. Preferably, the central electrodes are formed by a tie layer, for example of chrome, coated by a metallic layer of an unoxidizable metal.

With reference now to FIG. 2, a possible method of manufacturing the particular embodiment of the crystal resonator which is shown in FIG. 1 will be explained below.

A crystal substrate 20 is first formed to a predetermined thickness. Then, a first metal film 22 made of chromium (Cr) is formed over the substrate 20. This metal film 22 can be formed using a vacuum deposition method, or sputtering, or any other adequate method known to the person skilled in the art. A second metal film 23 made of gold (Au) is then formed over the first metal film. The entire surface of the metal film is then covered with a photoresist 25; thus producing a structure, a cross-section of which is outlined in the diagram of FIG. 2A (the actual thickness of the metal films is much less than represented in the diagram).

Figure 2A:
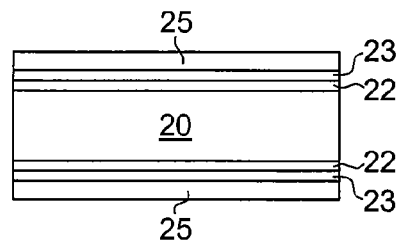
FIG. 2 illustrates a method of manufacturing the particular embodiment of a tuning fork resonator shown in FIG. 1.
Figure 2B:
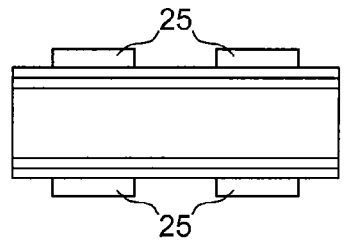

The photoresist 25 is then exposed to light through a photomask (not shown) so that it might be patterned through development processing. The patterned photoresist is depicted by the diagram of FIG. 2B.

Figure 2C:
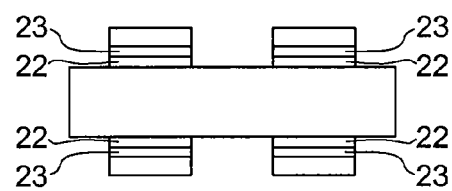
Figure 2D:
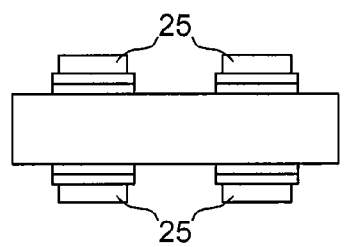

Using the patterned photoresist 25 as a mask, the metal films 22 and 23 are etched to form the outline of the tuning fork shaped resonator 1 (FIG. 2C). The remaining photoresist 25 is then patterned a second time in order to form an etching mask for the central electrodes (6a, 6b) (FIG. 2D).

Figure 2E:
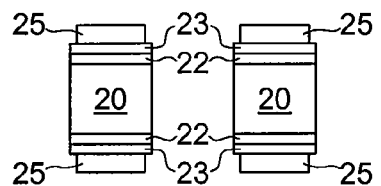

Using the metal films 22, 23 as etching masks, the piezoelectric substrate 20 is subjected to etching using any adequate etching solution known to the person skilled in the art. In particular, the etching solution is chosen so that it will remove neither the remaining photoresist 25 nor the gold film 23. The result of this etching step is to give the resonator (1) its tuning fork shape (FIG. 2E).

Figure 2F:
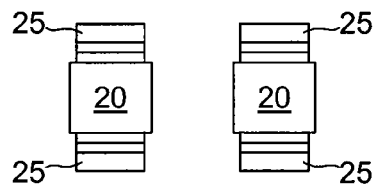

Then using the remaining photoresist 25 as a mask, the metal films 22, 23 are subjected to etching, in order to form the central electrodes 6a, 6b as well as the connection pads (7, 8) (shown in FIG. 1) on the surface of the piezoelectric substrate 20 (FIG. 2F). The photoresist layer 25 is then removed (for example by immersing it in a solvent). The removal of the photoresist exposes the metallizations 6a, 6b, 7 and 8.

Figure 2G:
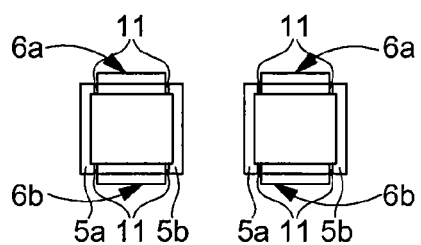

Finally, for example by using a vapor deposition mask (not shown), the lateral electrodes 5a, 5b are formed on the sides of the vibrating arms 2 and 3 (FIG. 2G). The sizes and the positioning of the apertures in the deposition mask are chosen in such a way that a narrow gap (or spacing) 11 is maintained on either arm, between the central and the lateral electrodes 6 and 5, so that these electrodes do not short-circuit one another.

According to the present invention, the central electrodes 6a, 6b of one arm are connected to the lateral electrode 5a, 5b of the other arm, while the central electrodes 6a, 6b of the other arm are connected to the lateral electrodes 5a, 5b of the first arm. According to the present method, one possible way of forming these connections is to design the deposition mask in such a way that, when the lateral electrodes 5a, 5b are formed, they will slightly overlap with the central electrodes 6a, 6b preferably in an area of the base part 4, so as to crate the metallization pattern shown in FIG. 1.

According to a possible embodiment of the present invention, the exposed surface of the lateral electrodes 5a, 5b can formed from an unoxidizable metal. In this case, the lateral electrodes can, for example, be formed by a first chromium layer over which a second gold layer is deposited during a further step of the manufacturing method. However, as previously mentioned, according to a preferred embodiment of the present invention, the lateral electrodes are made from an oxidizable metal. In this second case, the lateral electrodes can, for example, be made, as explained above, by simply forming a chromium film directly over the piezoelectric material. As in this case, the chromium layer forming the lateral electrodes does not have to be subsequently covered by a gold layer, the method for manufacturing the tuning fork resonator is advantageously shortened by one step.

Chromium being an oxidizable metal, a chromium-oxide film forms on the surface of the lateral electrodes 5a, 5b. This chromium-oxide film works as an insulating layer covering the lateral electrodes and preventing short-circuits.

Having described the invention with regard to certain specific embodiments, it is to be understood that these embodiments are not meant as limitations of the invention. Indeed, various modifications, adaptations and/or combination between embodiments may become apparent to those skilled in the art without departing from the scope of the annexed claims. For instance, grooves may be cut along the longitudinal axis of each vibrating arm.

What is claimed is:

1. A tuning fork piezoelectric resonator comprising:
a base part from which extends first and second parallel vibrating arms carrying a set of excitation electrodes that make the first and second parallel vibrating arms vibrate, wherein said set of excitation electrodes is formed by conductive deposits comprising an outer metallization layer, and said set of excitation electrodes comprises central electrodes disposed on opposite main surfaces of each vibrating arm and lateral electrodes covering lateral surfaces of each vibrating arm, wherein said central electrodes of said first arm and said lateral electrodes of said second arm are connected to a first terminal of an electrical excitation source and said lateral electrodes of said first arm and said central electrodes of said second arm are connected to a second terminal of said electrical excitation source, wherein, on each vibrating arm, said conductive deposits comprising the outer metallization layer form first electrodes and second electrodes, wherein the outer metallization layer of the first electrodes is covered with a superficial layer of spontaneously forming native oxide, and the outer metallization layer of the second electrodes is formed with an unoxidized metal, wherein when the first electrodes are the central electrodes the second electrodes are the lateral electrodes and when the first electrodes are the lateral electrodes the second electrodes are the central electrodes, and wherein said superficial native oxide layer has electrical insulating properties enabling said superficial native oxide layer to act as an electrical insulator.

2. The tuning fork piezoelectric resonator according to claim 1, wherein said lateral electrodes of both vibrating arms are covered with the layer of the spontaneously forming native oxide and said central electrodes of both vibrating arms are unoxidized metal.

3. The tuning fork piezoelectric resonator according to claim 1, wherein said outer metallization layer of the first electrodes is made out of metal selected from the group consisting of chrome, copper, aluminum, and titanium.

4. The tuning fork piezoelectric resonator according to claim 1, wherein said unoxidized metal is selected from the group consisting of silver and gold.

5. The tuning fork piezoelectric resonator according to claim 4, wherein said central electrodes are formed by a tie layer coated by a layer of gold or silver.

* * * * *